United States Patent
Kim et al.

(10) Patent No.: US 8,618,563 B2
(45) Date of Patent: Dec. 31, 2013

(54) LIGHT EMITTING DEVICE WITH VERTICALLY ADJUSTABLE LIGHT EMITTING PATTERN

(75) Inventors: Sun Kyung Kim, Yongin-Si (KR); Hyun Don Song, Incheon (KR); Jin Wook Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 238 days.

(21) Appl. No.: 12/693,263

(22) Filed: Jan. 25, 2010

(65) Prior Publication Data

US 2010/0237372 A1    Sep. 23, 2010

(30) Foreign Application Priority Data

Mar. 17, 2009  (KR) .................. 10-2009-0022549

(51) Int. Cl.
*H01L 27/15* (2006.01)
(52) U.S. Cl.
USPC    257/98; 257/79; 257/E33.006; 257/E33.068; 257/E33.074; 359/569
(58) Field of Classification Search
USPC ............. 257/98, E33.006, E33.067, E33.068, 257/79, E33.074; 359/569
See application file for complete search history.

(56) References Cited

U.S. PATENT DOCUMENTS

| | | | |
|---|---|---|---|
| 6,778,581 B1 | 8/2004 | Lipson | |
| 6,947,215 B2 * | 9/2005 | Hoshi | ............................ 359/576 |
| 7,308,181 B2 * | 12/2007 | Nobayashi et al. | ............ 385/131 |
| 7,769,067 B2 * | 8/2010 | Hori et al. | ................... 372/50.11 |
| 7,782,918 B2 * | 8/2010 | Tamamori et al. | ......... 372/43.01 |
| 2002/0018620 A1 * | 2/2002 | Koyama et al. | .................. 385/37 |
| 2005/0150864 A1 * | 7/2005 | Stasiak et al. | ................... 216/41 |
| 2006/0120414 A1 * | 6/2006 | Hori | ................................ 372/21 |
| 2006/0204865 A1 | 9/2006 | Erchak et al. | |
| 2007/0085102 A1 * | 4/2007 | Orita | .............................. 257/98 |
| 2007/0176191 A1 | 8/2007 | Im | |
| 2008/0093612 A1 | 4/2008 | Konno et al. | |
| 2010/0140643 A1 | 6/2010 | Cho et al. | |

FOREIGN PATENT DOCUMENTS

| | | |
|---|---|---|
| EP | 2 020 711 A1 | 2/2009 |
| JP | 2008-103627 A | 5/2008 |
| KR | 10-0730537 B1 | 6/2007 |
| KR | 10-0743468 B1 | 7/2007 |
| KR | 10-2007-0079249 A | 8/2007 |
| KR | 10-0801617 B1 | 2/2008 |
| KR | 10-2008-0061694 A | 7/2008 |
| KR | 10-2009-0001231 A | 1/2009 |
| KR | 10-2010-0063932 A | 6/2010 |
| WO | WO 2009/155899 A1 | 12/2009 |

* cited by examiner

*Primary Examiner* — John C Ingham
(74) *Attorney, Agent, or Firm* — Birch, Stewart, Kolasch & Birch, LLP

(57) ABSTRACT

A light emitting device including a light emitting structure including a first conductive type semiconductor layer, an active layer, and a second conductive type semiconductor layer; a first photonic crystal structure on the light emitting structure; a lower encapsulant on the first photonic crystal structure; and a second photonic crystal structure on the lower encapsulant.

18 Claims, 7 Drawing Sheets

LIGHT EMITTING DEVICE WITH VERTICALLY ADJUSTABLE LIGHT EMITTING PATTERN

CROSS-REFERENCE TO A RELATED APPLICATION

This application claims priority under 35 U.S.C. 119 to Korean Patent Application No. 10-2009-0022549, filed on Mar. 17, 2009, which is hereby incorporated by reference in its entirety.

BACKGROUND OF THE INVENTION

1. Field of the Invention

The present invention relates to a light emitting device and corresponding method of manufacturing a light emitting device.

2. Discussion of the Background

Nitride semiconductors are used in optical devices and high-power electronic devices because they exhibit a high thermal stability and a wide band gap. However, the light emitting efficiency of the Nitride semiconductor light emitting devices needs to be improved.

SUMMARY

Accordingly, one object of the present invention is to provide a light emitting device having superior light extraction efficiency.

Another object of the present invention is to provide a light emitting device in which a light emitting pattern is vertically adjustable and a method of manufacturing the same.

To achieve these and other advantages and in accordance with the purpose of the present invention, as embodied and broadly described herein, the present invention provides in one aspect a light emitting device including a light emitting structure including a first conductive type semiconductor layer, an active layer, and a second conductive type semiconductor layer. Also included in the light emitting device is a first photonic crystal structure on the light emitting structure, a lower encapsulant on the first photonic crystal structure, and a second photonic crystal structure on the lower encapsulant.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Hereinafter, a light emitting device according to embodiments will be described with reference to the accompanying drawings.

In the following description, when a layer (or film) is referred to as being 'on' another layer or substrate, it can be directly on the other layer or substrate, or intervening layers may also be present. Further, when a layer is referred to as being 'under' another layer, it can be directly under the other layer, and one or more intervening layers may also be present. In addition, when a layer is referred to as being 'between' two layers, it can be the only layer between the two layers, or one or more intervening layers may also be present.

Figure 1:
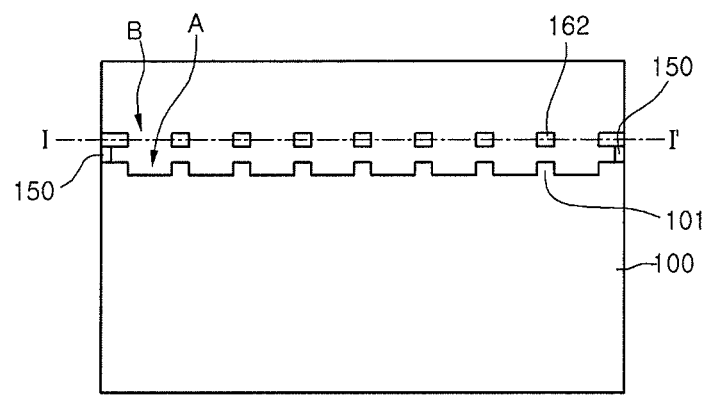
FIG. 1 is a vertical sectional view of a light emitting device according to an embodiment of the present invention.

FIG. 1 is a vertical sectional view of a light emitting device according to an embodiment and embodiment of the present invention. As shown, the light emitting device includes a light emitting structure 100, a first photonic crystal structure 101, a lower encapsulant A, and a second photonic crystal structure 162. Further, the light emitting structure 100 includes a first conductive type semiconductor layer 110, an active layer 120, and a second conductive type semiconductor layer 130 (see FIG. 3).

As shown in FIG. 1, the first photonic crystal structure 101 is disposed on the light emitting structure 100, the lower encapsulant A is disposed on the first photonic crystal structure 101, and the second photonic crystal structure 162 is disposed on the lower encapsulant A. In addition, the second photonic crystal structure 162 can include periodic or periodic patterns to improve light extraction efficiency, which will be discussed in more detail later.

In addition, in the embodiment shown in FIG. 1, the lower encapsulant A is disposed between the first photonic crystal structure 101 and the second photonic crystal structure 162. Further, an upper encapsulant B is disposed on the second photonic crystal structure 162. The lower or upper encapsulants A and B may also include air or epoxy, but are not limited thereto.

Further, a first layer 150 remains at edges of the light emitting structure 100, and may be formed of a semiconductor material that is in the same material group as the light emitting structure 100 or may include a dielectric layer, but is not limited thereto. The remaining first layer 150 thus supports the second photonic crystal structure 162. In addition, FIG. 2 is a horizontal sectional view along the line I-I' illustrating in more detail the second photonic crystal structure 162 of the light emitting device in FIG. 1.

Figure 2:
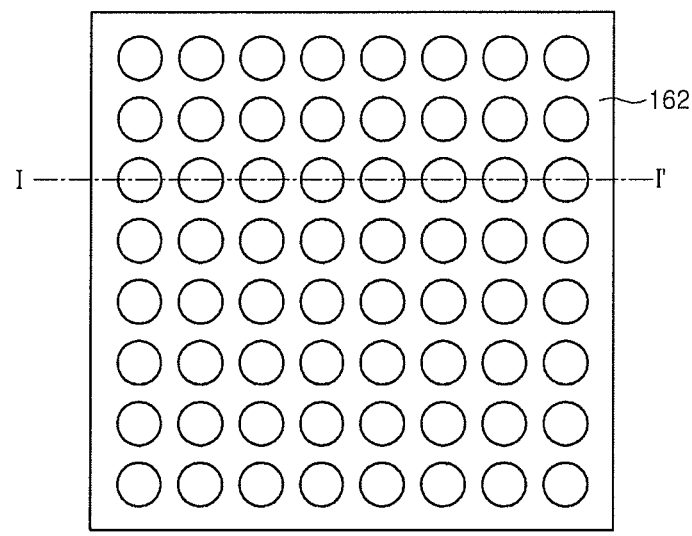
FIG. 2 is a horizontal sectional view of the light emitting device according to an embodiment of the present invention.

In addition, according to the structure of the light emitting device shown in the embodiment in FIGS. 1 and 2, light can be condensed in a vertical direction through period and positional adjustment of patterns of the first and second photonic crystal structures 101 and 162. In particular, the first photonic crystal structure 101 disposed on the light emitting structure 100 serves as a structure for improving the light extraction efficiency, and the second photonic crystal structure 162 serves as a structure for vertically adjusting a light emitting pattern of light. Thus, the first and second photonic crystal structures 101 and 162 are preferably differently set in structural factors, for example, a period of patterns.

In more detail, light emitted at nano frequencies (e.g., blue light at 460 nm) does not efficiently emit from the light emitting structure. Accordingly, the present invention provides nano-structures such as the first and second photonic crystal structures 101 and 162 that have predetermined nano-pattern periods that are selected to advantageously extract more light from the light emitting structure. A period refers to a distance between two adjacent nano-structures. These features will be described in more detail later.

Also, as shown in FIG. 1, the first and second photonic crystal structures 101 and 162 vertically and spacially correspond to each other. Alternatively, the first and second photonic crystal structures 101 and 162 may cross each other, or a portion of the first photonic crystal structure 101 may overlap the second photonic crystal structure 162.

Also, because the first and second photonic crystal structures 101 and 162 are disposed on the light emitting structure 100 with the encapsulant disposed therebetween, the light extraction efficiency is improved, and the light emitting pattern can be vertically adjusted. That is, the light extraction efficiency is significantly improved due to the first and second photonic crystal structures 101 and 162. In addition, because the encapsulant B disposed on the second photonic crystal structure 162 is formed of air or a material having a refractive index less than that of the light emitting structure 100, the light emitting pattern is vertically adjusted.

Figure 3:
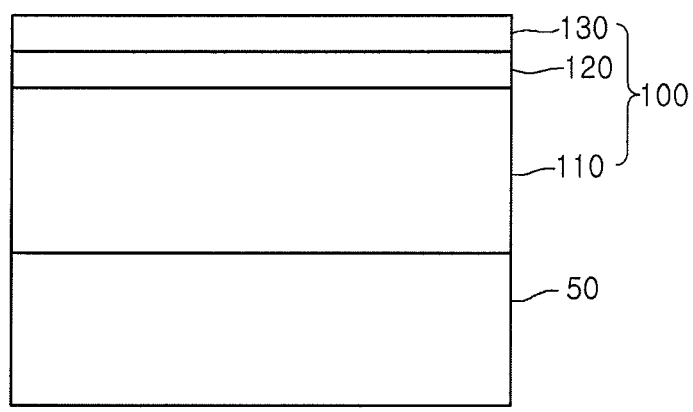
FIGS. 3 to 8 are sectional views illustrating a method of manufacturing a light emitting device according to an embodiment of the present invention.
Figure 5:
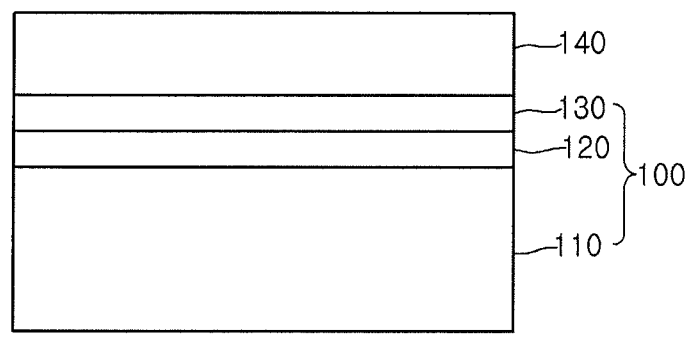
Figure 6:
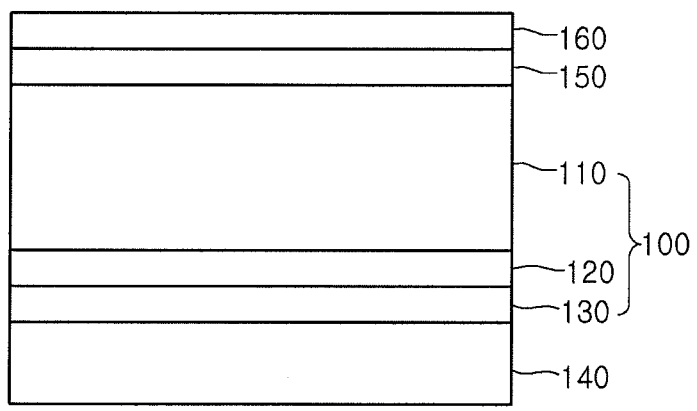

Hereinafter, a method of manufacturing a light emitting device according to an embodiment of the present invention will be described with reference to FIGS. 3 to 8. As shown in FIG. 3, the light emitting structure 100 is formed on a first substrate 50, and then the first substrate 50 is removed as shown in FIG. 5. However, the method is not limited to this arrangement. For example, the light emitting structure 100 may be formed on a conductive substrate such as a second electrode layer 140 as shown in FIG. 6.

Referring again to FIG. 3, the light emitting structure 100 including the first conductive type semiconductor layer 110, the active layer 120, and the second conductive type semiconductor layer 130 is formed on the first substrate 50. An undoped semiconductor layer may also be formed between the first substrate 50 and the first conductive type semiconductor layer 110. Also, the light emitting structure 100 may include an AlGaInN semiconductor layer, but is not limited thereto.

In addition, the first substrate 50 may be a sapphire ($Al_2O_3$) single crystal substrate, but is not limited thereto. A wet cleaning process may also be performed to remove impurities from a surface of the first substrate 50. The first conductive type semiconductor layer 110 can then be formed on the first substrate 50.

Further, an undoped semiconductor layer can be formed on the first substrate 50, and then, the first conductive type semiconductor layer 110 can be formed on the undoped semiconductor layer. The first conductive type semiconductor 110 layer can also be formed using a chemical vapor deposition (CVD) process, a molecular beam epitaxy (MBE) process, a sputtering process, or a hydrid vapour phase epitaxy process. Also, silane gas ($SiH_4$) containing n-type impurities such as trimethyl gallium (TMGa) gas, ammonia ($NH_3$) gas, nitrogen ($N_2$) gas, and silicon (Si) can be injected into a chamber to form the first conductive type semiconductor layer 110.

The active layer 120 is then formed on the first conductive type semiconductor layer 110. In addition, the active layer 120 serves as a layer in which electrons injected through the first conductive type semiconductor layer 110 recombine with electron holes injected through the second conductive type semiconductor layer 130 to emit light having an energy determined by a proper energy band of an active layer (a light emitting layer) material.

The active layer 120 can also have a quantum well structure in which nitride semiconductor thin films having different energy bands are alternately stacked one time or several times. For example, in the active layer, trimethyl gallium (TMGa) gas, ammonia ($NH_3$) gas, nitrogen ($N_2$) gas, and trimethyl indium (TMIn) gas can be injected to form a multi-quantum well structure having an InGaN/GaN structure, but is not limited thereto.

The second conductive type semiconductor layer 130 is then formed on the active layer 120. For example, bis(ethyl-cyclopentadienyl)magnesium [$EtC_{p2}Mg:Mg(C_2H_5C_5H_4)_2$] containing p-type impurities such as trimethyl gallium (TMGa) gas, ammonia ($NH_3$) gas, nitrogen ($N_2$) gas, and magnesium (Mg) gas can be injected into the chamber to form the second conductive type semiconductor layer 130, but is not limited thereto.

Figure 4:
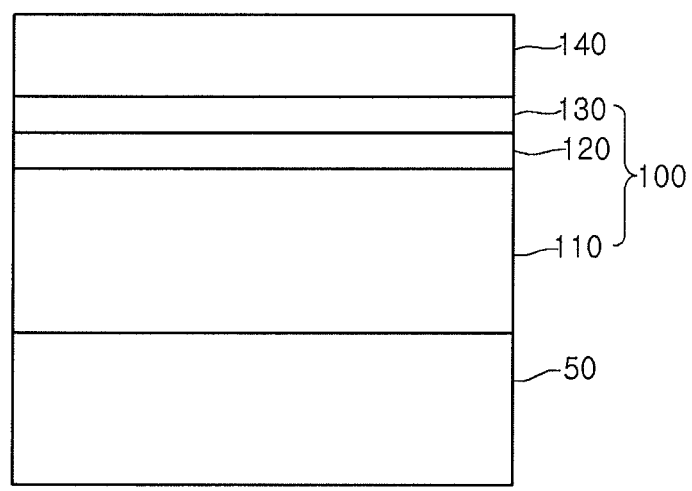

As shown in FIG. 4, a second electrode layer 140 is formed on the second conductive type semiconductor layer 130. The second electrode layer 140 may include at least one of semiconductor substrates in which titanium (Ti), chrome (Cr), nickel (Ni), aluminium (Al), platinum (Pt), gold (Au), tungsten (W) or an impurity is injected. The second electrode layer 140 can also include an ohmic layer, a reflective layer, an adhesive layer, and a second substrate.

Also, a single metal or a metal alloy and a metal oxide can be multi-stacked to improve the efficiency of electron hole injection. Further, the ohmic layer can be formed of at least one of ITO, IZO(IN—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, but is not limited thereto. The second electrode layer 140 can also include the reflective layer or the adhesive layer.

For example, when the second electrode layer 140 includes the reflective layer, the second electrode layer 140 can include a metal layer containing Al, Ag, or an alloy containing Al or Ag. Further, light generated in the active layer is effectively reflected by Al or Ag, which significantly improves light extraction efficiency of the light emitting device. Also, when the second electrode layer 140 includes the adhesive layer, the reflective layer can serve as the adhesive layer, or the adhesive layer can be formed using Ni or Au.

The second electrode layer 140 can also include a second substrate. Also, if the first conductive type semiconductor layer 110 has a sufficiently thick thickness, i.e., a thickness of about 50 μm or more, a process of forming the second substrate can be omitted. The second substrate can also be formed of a metal having good conductive properties, a metal alloy, or a conductive semiconductor material to efficiently inject the electron holes. For example, the second substrate can be formed of copper (Cu), a Cu alloy, Si, molybdenum (Mo), or SiGe. The second substrate can also be formed using an electrochemical metal deposition method or a bonding method using eutectic metals.

As shown in FIG. 5, the first substrate 50 is removed to expose the first conductive type semiconductor layer 110. The first substrate 50 can be separated using a high power laser or removed using a chemical etching process, for example. Also, the first substrate 50 can be removed by being physically grinded. The first substrate 50 is also removed to expose the first conductive type semiconductor layer 110. In addition, the exposed first conductive type semiconductor layer 110 can include a surface defective layer generated when the first substrate 50 is removed. The surface defective layer can then be removed using a wet or dry etching process, for example.

As shown in FIG. 6, a first layer 150 is formed on the light emitting structure 100, and can serve as a sacrificial layer to be removed in a subsequent process. Also, the first layer 150 can be formed by a deposition or growth process, and be formed of a material having an etch selectivity different from that of the light emitting structure 100. For example, the first layer 150 can be formed of a semiconductor material that is in the same material group as the light emitting structure 100 or include a dielectric layer, but is not limited thereto. For example, the first layer 150 can be formed of one of an oxide-based material such as $SiO_2$, $TiO_2$, $Al_2O_3$, and ITO, a nitride-based material such as $SiN_3$, and a fluoride-based material such as $MgF_2$, but is not limited thereto.

FIG. 6 also illustrates a second layer 160 being formed on the first layer 150. In more detail, the second layer 160 is the layer in which the second photonic crystal structure 162 is formed. Further, the second layer 160 can be formed by a deposition or growth process. In addition, the second layer 160 can have a refractive index greater than that of the light emitting structure 100, but is not limited thereto.

Also, the directional adjustment of emitting light is closely related to a refractive index contrast. Thus, as a refractive index difference increases, the directional adjustment is easier. In addition, the second layer 160 can be formed of a material having an etch selectivity with respect to the first layer 150. For example, the second layer 160 can be formed of a semiconductor material that is in the same material group as the light emitting structure 100 or include a dielectric layer.

For example, the second layer 160 can be formed of a material having an etch selectivity with respect to the first layer 150. Also, when the first layer 150 is formed of a dielectric material, the second layer 160 can be formed of a dielectric material having an etch selectivity with respect to the dielectric material of the first layer 150. For example, when the first layer 150 includes an oxide layer, the second layer 160 can include a nitride layer, but is not limited thereto.

Figure 7:
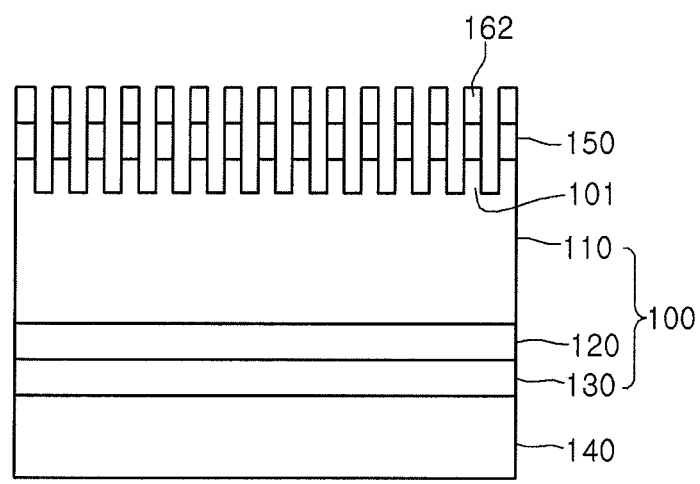

Next, as shown in FIG. 7, first patterns are used as a mask to etch portions of the second layer 160, the first layer 150, and the light emitting structure 100 so as to form the first photonic crystal structure 101 and the second photonic crystal structure 162 on the light emitting structure 100 and the second layer 160, respectively.

In addition, the first photonic crystal structure 101 and the second photonic crystal structure 162 are formed at the same time in FIG. 7, but the first photonic crystal structure 101 may be formed, and then, the second photonic crystal structure 162 may be formed. Further, the etching process can be performed using a dry etch process, for example. When the etch process is performed using the dry etch process, the first photonic crystal structure 101 and the second photonic crystal structure 162 can have periodic photonic crystal structures, respectively.

The first photonic crystal structure 101 can also include aperiodic patterns. For example, the periodic first photonic crystal structure 101 can be firstly formed on the light emitting structure 100 using the wet etching or dry etching process, and then, the second photonic crystal structure 162 can be separately formed.

As shown in FIG. 7, when the first photonic crystal structure 101 or the second photonic crystal structure 162 includes periodic patterns, a period of the periodic patterns is preferably $\lambda/n \sim 10 \times \lambda/n$, where, $\lambda$ represents a wavelength of light emitted from the active layer, and n represents a refractive index of the light emitting structure. That is, the crystal structures include a plurality of nano-structures having a predetermined nano-pattern period.

Also, when the pattern period of the photonic crystal structure is less than $\lambda/n$, diffraction does not occur, and thus the directional adjustment has no effect. When the pattern period of the photonic crystal structure is greater than $10 \times \lambda/n$, the diffraction intensity is weak, and thus the directional adjustment has no effect.

In addition, when the first photonic crystal structure 101 or the second photonic crystal structure 162 includes periodic patterns, the first and second photonic crystal structures 101 and 162 can have periods different from each other, for example. This is done because the first photonic crystal structure 101 focuses on the improvement of the light extraction efficiency, and the second photonic crystal structure 162 focuses on the adjustment of the light emitting pattern in a vertical direction. Thus, according to an embodiment of the present invention, the first photonic crystal structure 101 having a major function that improves the light extraction efficiency can have a period greater than that of the second photonic crystal structure 162 having a major function that adjusts the light emitting pattern in the vertical direction. Also, the periodic patterns may include a square lattice, a triangular lattice, Archimedean lattice, or quasicrystal. A period is also defined as a distance between two adjacent patterns in a corresponding crystal structure.

As shown in the example in FIG. 7, the first and second photonic crystal structures 101 and 162 vertically and spacially correspond to each other. However, other arrangements can also be used. For example, the first and second photonic crystal structure 101 and 162 can cross each other, or a portion of the first photonic crystal structure 101 can overlap the second photonic crystal structure 162. As discussed above, the first photonic crystal structure 101 is formed on the light emitting structure 100 using a primary etch process, but is not limited thereto. For example, the first photonic crystal structure 101 can be formed on an undoped semiconductor layer.

Figure 8:
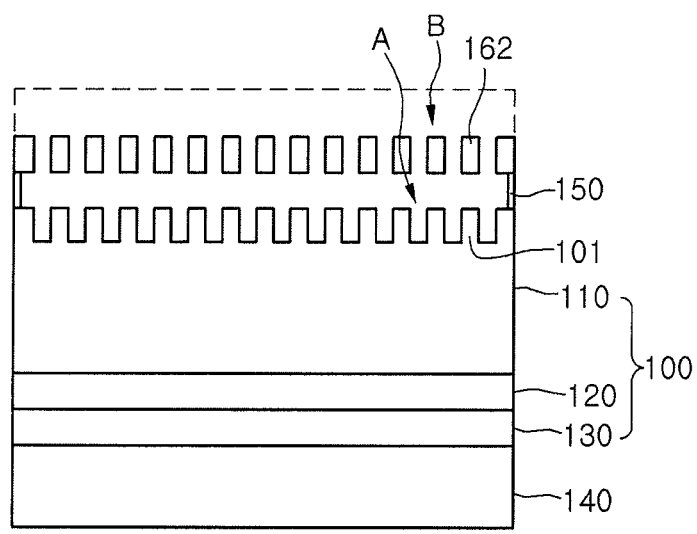

As shown in FIG. 8, the first layer 150 is removed. For example, a secondary etching process using the wet etch process can be performed to remove the first layer 150 serving as a sacrificial layer. Other removal methods can also be used. Further, an etching solution used for the wet etch process may use a solution less affecting the patterns of the second photonic crystal structure and the first photonic crystal structure.

In addition, as shown in FIG. 8, the first layer 150 remains at edges of the light emitting structure 100 and thus can support the second photonic crystal structure 162. For example, an etch time can be controlled so that the first layer 150 remains at edges of the light emitting structure 100, and thus, the first layer 150 remains between the first photonic crystal structure 101 and the second photonic crystal structure 162.

The second layer 160 can also remain at edges of the light emitting structure 100 to support the second photonic crystal structure 162. For example, the first layer 150 may not be formed at edges of the light emitting structure 100 when the first layer 150 is formed on the light emitting structure 100. Thereafter, the second layer 160 can be formed at edges of the first layer 150 and the light emitting structure 100. Then, the photonic crystal structure can be patterned to etch and remove the first layer 150. Therefore, the second layer 160 can remain at edges of the light emitting structure 100.

After the first layer 150 is removed, an encapsulant may or may not be filled in spaces therebetween. In the present embodiment, the encapsulant includes a lower encapsulant A and an upper encapsulant B. For example, the lower and/or upper encapsulants A and B may include air or epoxy. Each of the encapsulants A and B can also have a refractive index less than those of the light emitting structure 100 and the second layer 160. Thus, because the second photonic crystal structure 162 is surrounded by the lower and/or upper encapsulants A and B having low refractive indexes, the light extraction efficiency is maximized.

Thereafter, for a current flow, a first electrode can be formed on the light emitting structure 100. The second photonic crystal structure 162 can also not be formed on an upper portion of the light emitting structure 100 on which the first electrode is formed.

Thus, in the present embodiment, the light extraction efficiency is improved, and the light emitting patterns can be vertically adjusted.

Figure 9:
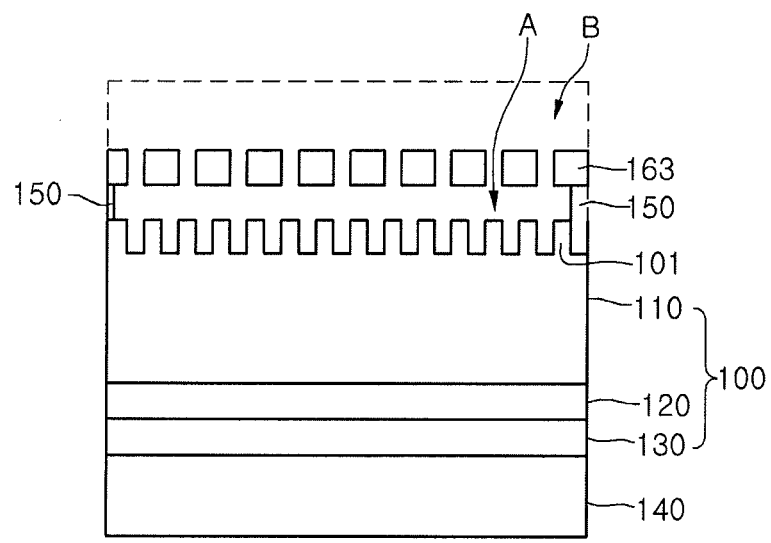
FIG. 9 is a vertical sectional view of a light emitting device according to another embodiment of the present invention.

Next, FIG. 9 is a vertical sectional view of a light emitting device according to another embodiment of the present invention, which adopts some characteristics of the light emitting device according to the first embodiment. However, in the second embodiment, the first photonic crystal structure 101 and a second photonic crystal structure 163 vertically, spacially, and partially overlap each other or cross each other.

Further, as shown in FIG. 9, the first layer 150 remains at edges of the light emitting structure 100. Also, the first layer 150 can be formed of a semiconductor material that is in the same material group as the light emitting structure 100 or include a dielectric layer, but is not limited thereto. As a result, the remaining first layer 150 supports the second photonic crystal structure 163.

Figure 10:
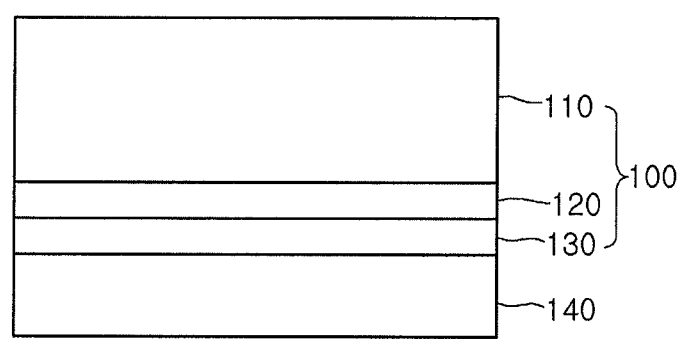
FIGS. 10 to 15 are section views illustrating a method of manufacturing the light emitting device according to the other embodiment of the present invention.

Hereinafter, a method of manufacturing the light emitting device according to this embodiment will be described with reference to FIGS. 10 to 15. As shown in FIG. 10, the second electrode layer 140 is formed on the light emitting structure 100 including the first conductive type semiconductor layer 110, the active layer 120, and the second conductive type semiconductor layer 130. This is similar to the other embodiment shown in FIG. 4, for example.

Figure 11:
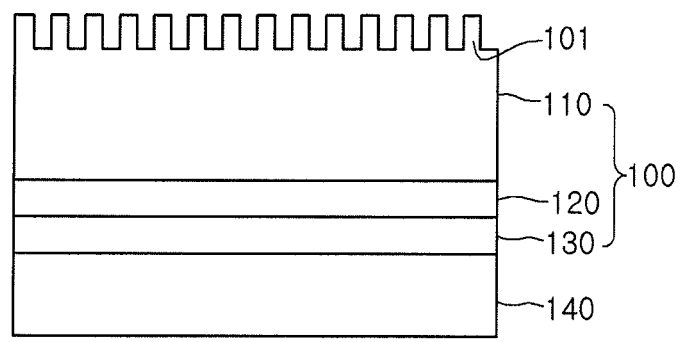

As shown in FIG. 11, the first photonic crystal structure 101 is formed on the light emitting structure 100. For example, second patterns can be formed on the light emitting structure 100, and then, the light emitting structure 100 can be partially removed by a wet or dry etch process using the second patterns as a mask to form the first photonic crystal structure 101. The first photonic crystal structure 101 can also include periodic or aperiodic patterns.

Figure 12:
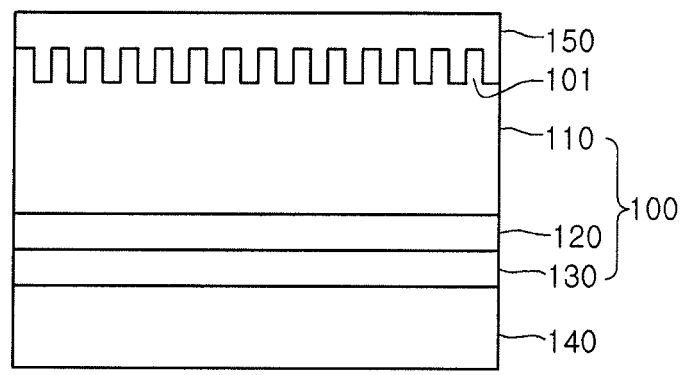
Figure 13:
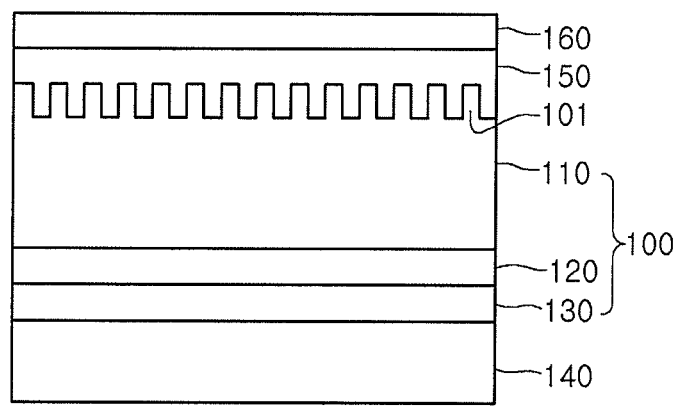

As shown in FIG. 12, the second patterns are removed, and the first layer 150 is formed on the light emitting structure 100 including the first photonic crystal structure 101. The first layer 150 can also include a dielectric layer, for example. As shown in FIG. 13, the second layer 160 is formed on the first layer 150, and is used to form the second photonic crystal structure 163. In particular, the second layer 160 can be formed by a deposition or growth process, and have a refractive index greater than that of the light emitting structure 100. The second layer 160 can also be formed of a material having an etch selectivity with respect to the first layer 150.

Figure 14:
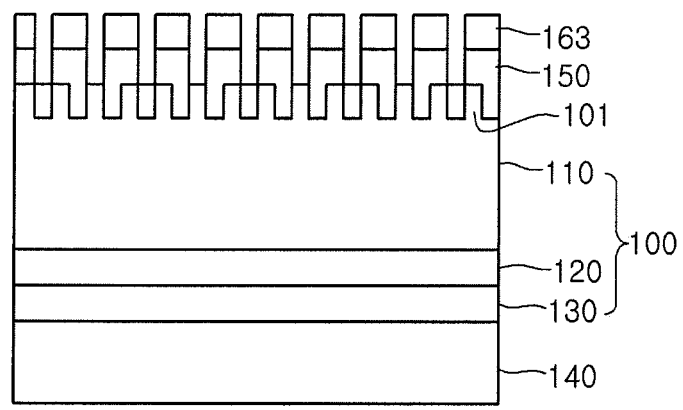

As shown in FIG. 14, third patterns are formed on the second layer 160, and the second layer 160 and the first layer 150 are partially etched by a wet or dry etch process using the third patterns as a mask to form the second photonic crystal structure 163. Also, the first photonic crystal structure 101 and the second photonic crystal structure 163 vertically, spacially, and partially overlap each other or cross each other.

Figure 15:
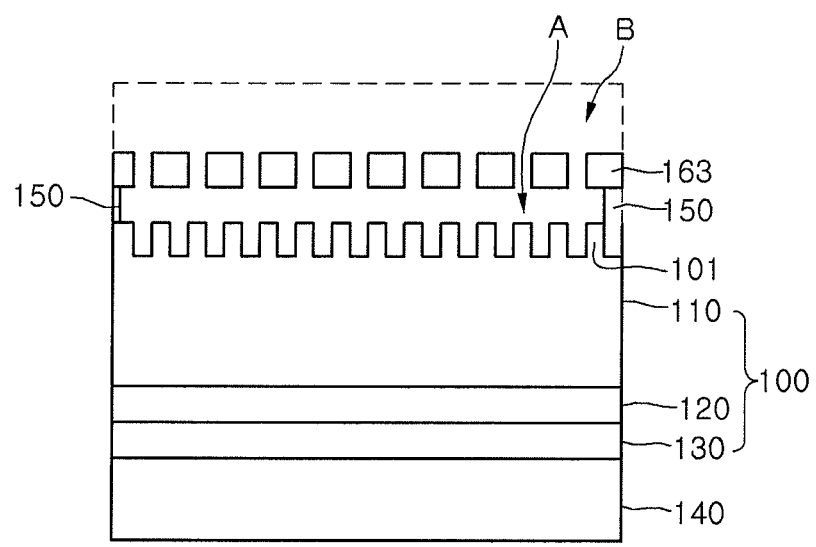

As shown in FIG. 15, the first layer 150 is removed using the wet etch process, for example. Also, in this embodiment, the first layer 150 remains outside the light emitting structure 100 and thus supports the second photonic crystal structure 163. For example, an etch time can be controlled so that the first layer 150 remains outside the light emitting structure 100, and thus, the first layer 150 remains between the first photonic crystal structure 101 and the second photonic crystal structure 163, but is not limited thereto.

The second layer 160 can also remain at edges of the light emitting structure 100 to support the second photonic crystal structure 163. For example, the first layer 150 may not be formed at edges of the light emitting structure 100 when the first layer 150 is formed on the light emitting structure 100. Thereafter, the second layer 160 can be formed at edges of the first layer 150 and the light emitting structure 100. Then, the photonic crystal structure can be patterned to etch and remove the first layer 150. Therefore, the second layer can remain at edges of the light emitting structure 100. Thereafter, the third layer can be removed to form a lower encapsulant A and an upper encapsulant B.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Thus, the embodiments of the present invention improve the luminous efficiency by increasing the light extraction efficiency are required. Further, because light generated in light emitting devices is produced by a spontaneous emission process, specific-directional light does not occur. However, the embodiments of the present invention use novel arrangement of the photonic structures to control the directional light and improve the efficiency of the light emitting devices.

Also, because the specific-directional light exists in the present invention, the light of the light emitting devices existing in a region out of a lens region within a back light unit (BLU) or a projector is useful.

Thus, because the embodiments of the present invention use photonic crystal structures including a plurality of nano-structures having a predetermined nano-pattern period, the amount of light extracted from the light emitting structures is significantly improved. In one embodiment, the pattern period of the nano-structures is $\lambda/n \sim 10 \times \lambda/n$, which the inventors of the present application have determined produce significant advantages (e.g., a significant improvement in a light extraction efficiency). The nano-structure can also be arranged to be one above the other or be arranged to cross or partially overlap each other as described above.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a light emitting structure including a first conductive type semiconductor layer, an active layer, and a second conductive type semiconductor layer;

a first photonic crystal structure on the light emitting structure;

a second photonic crystal structure on the first photonic crystal structure; and a first layer on outside edge portions of the light emitting structure, wherein air is between the first photonic crystal structure and the second photonic crystal structure, wherein the air extends from the first photonic crystal structure to the second photonic crystal structure, wherein the first photonic crystal structure comprises a same material as the light emitting structure, wherein the first photonic crystal structure comprises a plurality of nano-structures having a predetermined nano-pattern period, wherein the air is disposed between the plurality of nano-structures, and wherein the first layer is disposed only at the outside edge portions of the light emitting structure.

2. The light emitting device according to claim 1, wherein the second photonic crystal structure includes a plurality of nano-structures having a predetermined nano-pattern period.

3. The light emitting device according to claim 1, wherein the first photonic crystal structure and the second photonic crystal structure have periods different from each other.

4. The light emitting device according to claim 1, wherein the first photonic crystal structure and the second photonic crystal structure vertically and spacially correspond to each other.

5. The light emitting device according to claim 1, wherein the first photonic crystal structure and the second photonic crystal structure vertically, spacially, and partially overlap each other.

6. The light emitting device according to claim 1, wherein the first photonic crystal structure and the second photonic crystal structure vertically, spacially, and partially cross each other.

7. The light emitting device according to claim 1, further comprising an upper encapsulant on the second photonic crystal structure.

8. The light emitting device according to claim 7, wherein the upper encapsulant has a refractive index less than that of the light emitting structure.

9. The light emitting device according to claim 7, wherein the upper encapsulant includes air or epoxy.

10. The light emitting device according to claim 1, wherein the first layer includes a semiconductor material.

11. The light emitting device according to claim 1, wherein the second photonic crystal structure has a refractive index greater than that of the light emitting structure.

12. The light emitting device according to claim 1, wherein the first photonic crystal structure has a period greater than that of the second photonic crystal structure.

13. The light emitting device according to claim 1, wherein the air between the plurality of nano-structures is connected to each other and makes an air layer.

14. The light emitting device according to claim 1, wherein the air between the plurality of nano-structures is connected to each other and do not overlap with the first layer.

15. A light emitting device comprising:
a light emitting structure including a first conductive type semiconductor layer, an active layer, and a second conductive type semiconductor layer;
a first photonic crystal structure on the light emitting structure;
a lower encapsulant on the first photonic crystal structure;
a second photonic crystal structure on the lower encapsulant; and
a first layer on outside edge portions of the light emitting structure,
wherein the first layer comprises a semiconductor material,
wherein the first layer is disposed higher than the first photonic crystal structure and lower than the second photonic crystal structure, and
wherein the first layer is disposed only at the outside edge portions of the light emitting structure.

16. The light emitting device according to claim 15, wherein the lower encapsulant comprises air.

17. A light emitting device comprising:
a light emitting structure including a first conductive type semiconductor layer, and a second conductive type semiconductor layer;
a first photonic crystal structure on the light emitting structure;
a lower encapsulant on the first photonic crystal structure;
a second photonic crystal structure on the lower encapsulant; and
a first layer on outside edge portions of the light emitting structure,
wherein the first layer contacts both the first photonic crystal structure and the second photonic crystal structure,
wherein the first layer is disposed higher than the first photonic crystal structure and lower than the second photonic crystal structure, and
wherein the first layer is disposed only at the outside edge portions of the light emitting structure.

18. The light emitting device according to claim 17, wherein the first layer comprises a semiconductor material.

* * * * *